United States Patent
Fujie et al.

(10) Patent No.: US 9,793,835 B2
(45) Date of Patent: Oct. 17, 2017

(54) POWER CONVERSION DEVICE AND METHOD FOR DIAGNOSING FAILURE THEREOF

(71) Applicant: Mitsubishi Electric Corporation, Chiyoda-ku, Tokyo (JP)

(72) Inventors: Kenichi Fujie, Tokyo (JP); Katsuya Tsujimoto, Tokyo (JP); Takamasa Asai, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/378,110

(22) Filed: Dec. 14, 2016

(65) Prior Publication Data

US 2017/0093311 A1 Mar. 30, 2017

Related U.S. Application Data

(62) Division of application No. 14/430,590, filed as application No. PCT/JP2012/078349 on Nov. 1, 2012, now Pat. No. 9,564,841.

(51) Int. Cl.
*H02H 7/08* (2006.01)
*H02P 6/12* (2006.01)
*H02M 7/5387* (2007.01)
*G01R 31/42* (2006.01)
*H02M 1/32* (2007.01)

(52) U.S. Cl.
CPC .............. *H02P 6/12* (2013.01); *G01R 31/42* (2013.01); *H02M 1/32* (2013.01); *H02M 7/5387* (2013.01)

(58) Field of Classification Search
CPC .................. H02P 6/12; H02M 1/32
USPC ....................................... 318/400.21
See application file for complete search history.

(56) References Cited

U.S. PATENT DOCUMENTS

2007/0046274 A1 3/2007 Matsuoka

FOREIGN PATENT DOCUMENTS

| JP | 2001278087 A | 10/2001 |
|----|--------------|---------|
| JP | 2007060762 A | 3/2007 |
| JP | 4385068 B2 | 12/2009 |
| JP | 2012039740 A | 2/2012 |

OTHER PUBLICATIONS

International Search Report of PCT/JP2012/078349 dated Feb. 5, 2013.

*Primary Examiner* — Erick Glass
(74) *Attorney, Agent, or Firm* — Sughrue Mion, PLLC; Richard C. Turner

(57) ABSTRACT

Provided is a power conversion device, including a fault determination unit (11) for determining, based on phase voltages of a polyphase dynamo-electric machine (4) detected by phase voltage detection units (10), a power, earth, or open fault of armature windings of the polyphase dynamo-electric machine (4). The fault determination unit (11) determines, in a state that all power semiconductor switching elements (2) are in an off state and no induction voltage is generated in the armature windings of the polyphase dynamo-electric machine (4), the power fault when all the phase voltages are substantially equal to an anode potential of a DC power supply (3), the earth fault when all the phase voltages are substantially equal to a cathode potential of the DC power supply (3), and the open fault when all the phase voltages are not substantially the same potential.

3 Claims, 11 Drawing Sheets

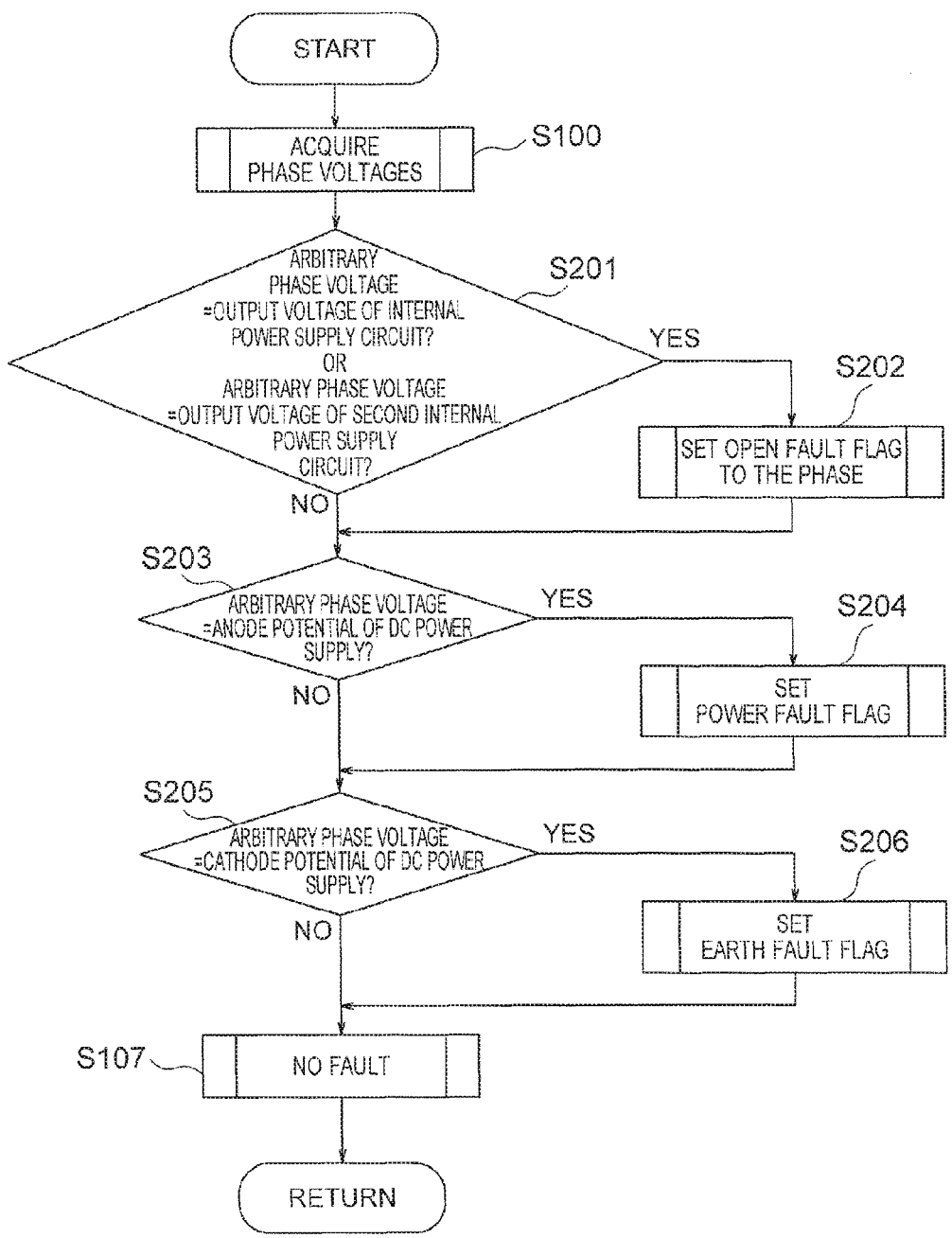

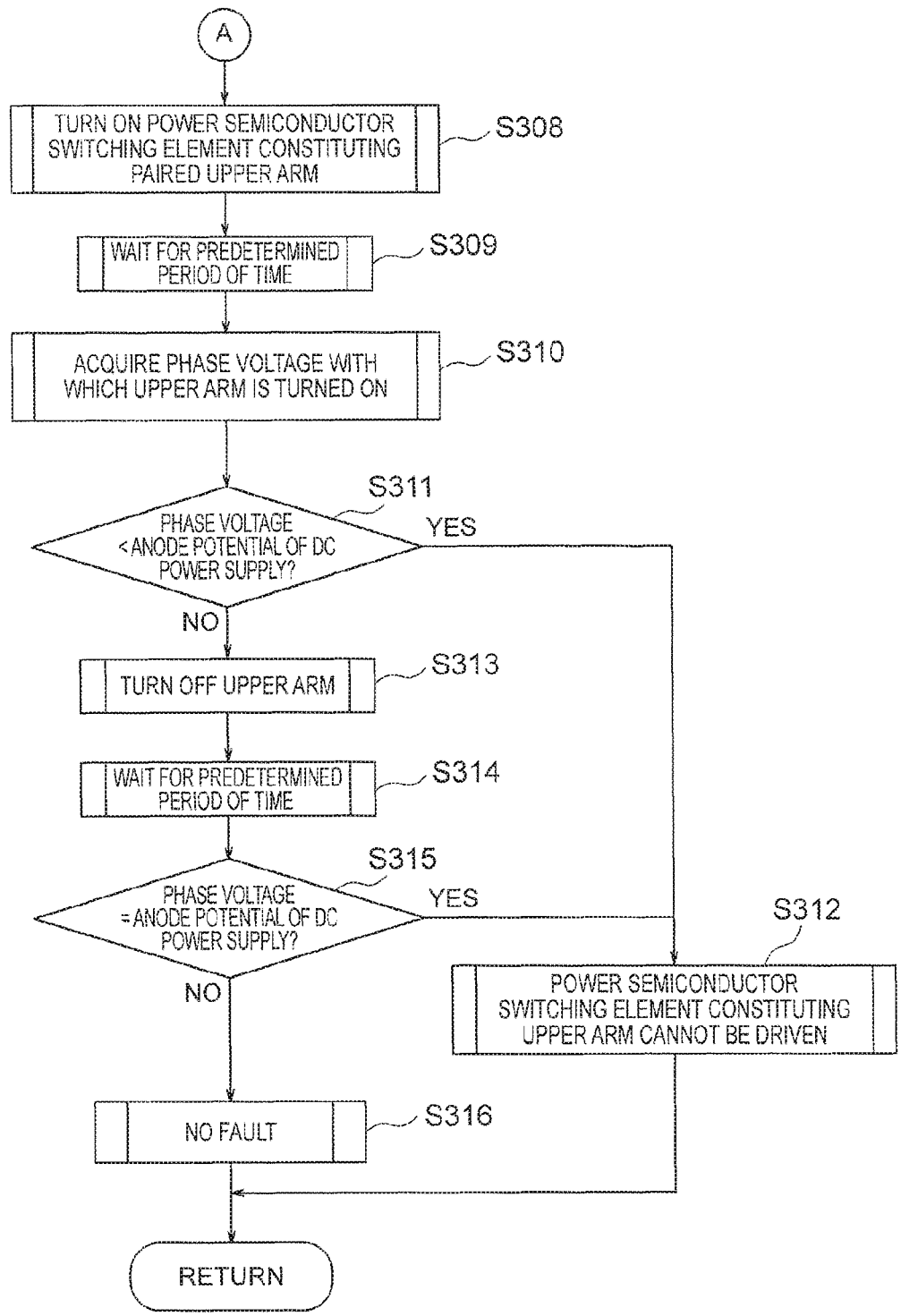

POWER CONVERSION DEVICE AND METHOD FOR DIAGNOSING FAILURE THEREOF

CROSS REFERENCE TO RELATED APPLICATIONS

This application is a divisional of U.S. application Ser. No. 14/430,590, filed Mar. 24, 2105, which is a National Stage of International Application No. PCT/JP2012/078349 filed Nov. 1, 2012, the contents of which are incorporated herein by reference in its entirety.

TECHNICAL FIELD

The present invention relates to a power conversion device and a fault diagnosis method therefor, in particular, a power conversion device for supplying electric power to a polyphase dynamo-electric machine or rectifying an induction voltage from the polyphase dynamo-electric machine, and a fault diagnosis method for the power conversion device.

BACKGROUND ART

In Patent Literature 1, there is proposed a method of detecting a short circuit fault in a diode of a full-wave rectifying circuit with high precision. More specifically, a voltage source or a current source is connected to an arbitrary AC terminal to determine an abnormality based on a voltage value or a current value of the AC terminal.

CITATION LIST

Patent Literature

[PTL 1] JP 4385068 B2

SUMMARY OF INVENTION

Technical Problem

In Patent Literature 1, normality is determined based on the fact that no current flows from a fault detection terminal (P terminal) to an armature winding, and hence there is a problem in that, in a case where a path from the fault detection terminal (P terminal) to the armature winding is open-circuited, not only it is impossible to detect the open circuit, but it is also impossible to detect a short circuit fault in the full-wave rectifying circuit, or to detect a power fault and an earth fault in the armature winding.

The present invention has been made to solve the above-mentioned problem, and it is an object of the present invention to provide a power conversion device capable of detecting a power fault, an earth fault, and an open fault of a polyphase dynamo-electric machine without causing a large current to flow, and a fault diagnosis method for the power conversion device.

Solution to Problem

According to one embodiment of the present invention, there is provided a power conversion device, in which a plurality of phase bridge circuits each including power semiconductor switching elements, which are connected in series with each other to construct an upper arm and a lower arm, are connected in parallel to one another, both terminals of the plurality of phase bridge circuits are connected to a DC power supply, which is chargeable and dischargeable, and nodes between the power semiconductor switching elements of the upper arm and the lower arm of the plurality of phase bridge circuits are connected to AC terminals of armature windings of a polyphase dynamo-electric machine, for performing AC-DC power conversion or DC-AC power conversion, the power conversion device including: an internal power supply circuit; a driving circuit for turning on or off the power semiconductor switching elements; a discharge type constant current circuit for connecting an output terminal of the internal power supply circuit and one of the AC terminals of the armature windings of the polyphase dynamo-electric machine, to thereby cause a constant current to flow from the output terminal of the internal power supply circuit to the one of the AC terminals of the armature windings of the polyphase dynamo-electric machine; a backflow prevention diode connected in series with the discharge type constant current circuit, for preventing a backflow current from the one of the AC terminals of the armature windings of the polyphase dynamo-electric machine to the internal power supply circuit; pull-down resistor for connecting others of the AC terminals of the armature windings of the polyphase dynamo-electric machine, to which the discharge type constant current circuit is not connected, to a cathode potential of the DC power supply; phase voltage detection units for detecting phase voltages of the armature windings of the polyphase dynamo-electric machine; and a fault determination unit for determining a power fault, an earth fault, and an open fault of the armature windings of the polyphase dynamo-electric machine based on the phase voltages of respective phases, which are detected by the phase voltage detection units, in which the fault determination unit determines, in a state in which all the power semiconductor switching elements are in an off state and no induction voltage is generated in the armature windings of the polyphase dynamo-electric machine, the power fault when all the phase voltages are substantially equal to an anode potential of the DC power supply, the earth fault when all the phase voltages are substantially equal to the cathode potential of the DC power supply, and the open fault when all the phase voltages are not substantially the same potential.

Advantageous Effects of Invention

According to one embodiment of the present invention, the power conversion device, in which the plurality of phase bridge circuits each including the power semiconductor switching elements, which are connected in series with each other to construct the upper arm and the lower arm, are connected in parallel to one another, both terminals of the plurality of phase bridge circuits are connected to the DC power supply, which is chargeable and dischargeable, and the nodes between the power semiconductor switching elements of the upper arm and the lower arm of the plurality of phase bridge circuits are connected to the AC terminals of the armature windings of the polyphase dynamo-electric machine, for performing AC-DC power conversion or DC-AC power conversion, includes: the internal power supply circuit; the driving circuit for turning on or off the power semiconductor switching elements; the discharge type constant current circuit for connecting the output terminal of the internal power supply circuit and one of the AC terminals of the armature windings of the polyphase dynamo-electric machine, to thereby cause the constant current to flow from the output terminal of the internal power supply circuit to the one of the AC terminals of the armature windings of the polyphase dynamo-electric machine; the backflow prevention diode connected in series with the discharge type constant current circuit, for preventing the backflow current from the one of the AC terminals of the armature windings of the polyphase dynamo-electric machine to the internal power supply circuit; the pull-down resistors for connecting the others of the AC terminals of the armature windings of the polyphase dynamo-electric machine, to which the discharge type constant current circuit is not connected, to the cathode potential of the DC power supply; the phase voltage detection units for detecting the phase voltages of the armature windings of the polyphase dynamo-electric machine; and the fault determination unit for determining the power fault, the earth fault, and the open fault of the armature windings of the polyphase dynamo-electric machine based on the phase voltages of the respective phases, which are detected by the phase voltage detection units, in which the fault determination unit determines, in the state in which all the power semiconductor switching elements are in an off state and no induction voltage is generated in the armature windings of the polyphase dynamo-electric machine, the power fault when all the phase voltages are substantially equal to the anode potential of the DC power supply, the earth fault when all the phase voltages are substantially equal to the cathode potential of the DC power supply, and the open fault when all the phase voltages are not substantially the same potential. Therefore, the power conversion device according to one embodiment of the present invention may detect the power fault, the earth fault, and the open fault of the polyphase dynamo-electric machine without causing a large current to flow.

BRIEF DESCRIPTION OF DRAWINGS

FIG. 8 is a flow chart illustrating operation of a fault determination unit 11 in the power conversion device according to the fourth embodiment of the present invention.

FIG. 9B is a flow chart illustrating operation of the fault determination unit 11 in the power conversion device according to the fifth embodiment of the present invention.

DESCRIPTION OF EMBODIMENTS

Figure 1:
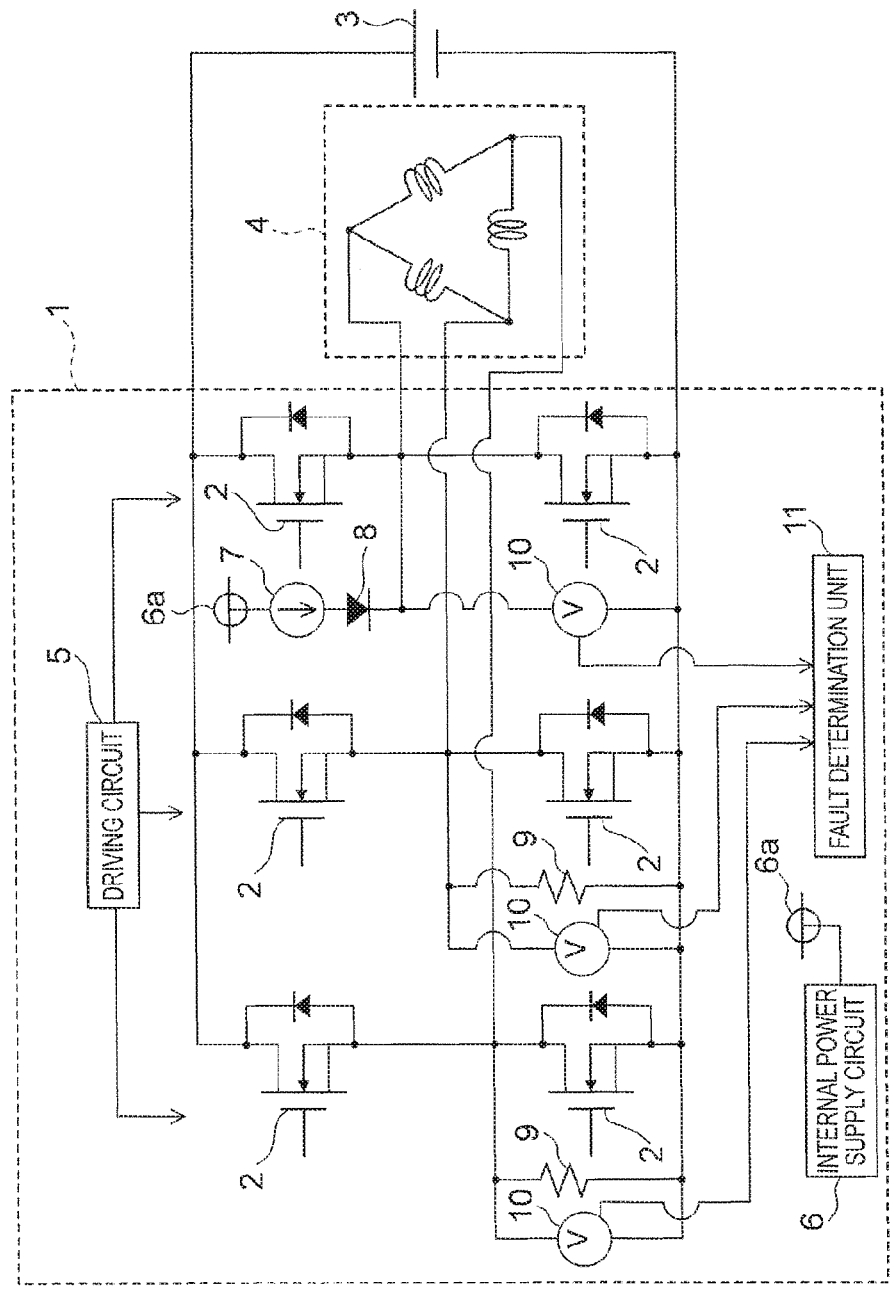
FIG. 1 is a block diagram illustrating a configuration of a power conversion device according to a first embodiment of the present invention.

Referring to the accompanying drawings, embodiments of the present invention are described in detail below. In the drawings, the same or similar components are denoted by the same reference symbols.

First Embodiment

FIG. 1 illustrates a configuration of a power conversion device according to a first embodiment of the present invention. As illustrated in FIG. 1, a power conversion device 1 is configured so that a predetermined number of (three in FIG. 1) phase bridge circuits each including two power semiconductor switching elements 2, which are connected in series with each other to construct upper and lower arms, are connected in parallel to one another. Both terminals (a pair of terminals) of the phase bridge circuits are connected to a DC power supply 3, which is chargeable and dischargeable, and nodes between the power semiconductor switching elements 2 constituting the phase bridge circuits are respectively connected to AC terminals of armature windings of respective phases of a polyphase dynamo-electric machine 4. The power conversion device 1 performs AC-DC power conversion or DC-AC power conversion between an internal power supply circuit 6 and the DC power supply 3.

Note that, in FIG. 1, a three-phase dynamo-electric machine is exemplified as the polyphase dynamo-electric machine 4. Therefore, in the following description, the polyphase dynamo-electric machine 4 is described as the three-phase dynamo-electric machine. However, the present invention is not limited to such case, and the number of phases of the polyphase dynamo-electric machine 4 may be two, six, or the like, or the polyphase dynamo-electric machine 4 may be a star-connected dynamo-electric machine.

The power conversion device 1 includes six power semiconductor switching elements 2, a driving circuit 5, the internal power supply circuit 6, a discharge type constant current circuit 7, a backflow prevention diode 8, pull-down resistors 9, phase voltage detection units 10, and a fault determination unit 11.

The driving circuit 5 turns on or off each of the six power semiconductor switching elements 2.

The internal power supply circuit 6 outputs a predetermined voltage from an output terminal 6a.

The discharge type constant current circuit 7 is connected to the output terminal 6a of the internal power supply circuit 6 to cause a constant current to flow from the output terminal 6a of the internal power supply circuit 6 to an arbitrary one of the AC terminals of the armature windings of the polyphase dynamo-electric machine 4.

The backflow prevention diode 8 is connected between the discharge type constant current circuit 7 and the AC terminal of the armature windings of the polyphase dynamo-electric machine 4 to prevent a backflow current from the AC terminal of the armature windings of the polyphase dynamo-electric machine 4 to the internal power supply circuit 6.

The pull-down resistors 9 respectively connect the other two AC terminals of the armature windings of the polyphase dynamo-electric machine 4, which are not connected to the discharge type constant current circuit 7, to a cathode potential of the DC power supply 3.

The phase voltage detection units 10 detect phase voltages of the armature windings of the polyphase dynamo-electric machine 4.

The fault determination unit 11 determines, based on values of the phase voltages of respective phases of the polyphase dynamo-electric machine 4, which are detected by the phase voltage detection units 10, a power fault (or line-to-power fault), an earth fault (or ground fault or line-to-ground fault), and an open fault of armature windings of the polyphase dynamo-electric machine 4.

The term "power fault" as used herein means that insulation between an armature winding of the polyphase dynamo-electric machine 4 and the DC power supply 3 is extremely lowered so that a connection is established therebetween by arcing or a conductor. For example, a case where a wiring is brought into contact with an anode terminal (power supply line) of the DC power supply 3 is exemplified. When the power fault occurs, all the phase voltages of the polyphase dynamo-electric machine 4 become substantially equal to an anode potential of the DC power supply 3. The term "substantially" as used herein means that, even when detection errors of the phase voltage detection units 10 are subtracted, the phase voltages of the polyphase dynamo-electric machine 4 are equal to the anode potential of the DC power supply 3.

Moreover, the term "earth fault" means that insulation between an armature winding of the polyphase dynamo-electric machine 4 and a GND terminal is extremely lowered so that a connection is established therebetween by arcing or a conductor. For example, a case where a wiring is brought into contact with a ground wire is exemplified. When the earth fault occurs, all the phase voltages of the polyphase dynamo-electric machine 4 become substantially equal to the cathode potential of the DC power supply 3. The term "substantially" as used herein means that, even when the detection errors of the phase voltage detection units 10 are subtracted, the phase voltages of the polyphase dynamo-electric machine 4 are equal to the cathode potential of the DC power supply 3.

The term "open fault" means that a part of wirings of the armature windings of the polyphase dynamo-electric machine 4 is open-circuited. When the open fault occurs, all the phase voltages of the polyphase dynamo-electric machine become not substantially the same potential. The term "substantially" as used herein means that, even when the detection errors of the phase voltage detection units 10 are subtracted, all the phase voltages of the polyphase dynamo-electric machine 4 are the same potential as one another.

Note that, in FIG. 1, the power semiconductor switching elements 2 include, for example, MOSFETs or IGBTs.

Moreover, the DC power supply 3 includes, for example, a lead accumulator (battery), a lithium ion battery, or an electric double layer capacitor, which is generally used as a power supply for an automobile.

The driving circuit 5 includes, for example, a push-pull type predriver using a driving power supply using a charge pump circuit or a bootstrap circuit.

The internal power supply circuit 6 includes, for example, a DC-DC converter, a series regulator, or a constant voltage diode.

The discharge type constant current circuit 7 includes, for example, a constant current diode, or a constant current circuit using transistors, such as a current mirror circuit.

The phase voltage detection units 10 include, for example, transistors, or differential amplifier circuits using operational amplifiers.

A description is given of a method of setting a constant current value of the discharge type constant current circuit 7. In a case where a leakage from the armature windings of the polyphase dynamo-electric machine 4 to the cathode potential of the DC power supply 3 due to salt water or mud water occurs, the phase voltages of the polyphase dynamo-electric machine 4 at the time need to be differentiated from the cathode potential of the DC power supply 3, and hence there needs to be a potential difference between the phase voltages of the polyphase dynamo-electric machine 4 and the cathode potential of the DC power supply 3. For example, in a case where it is assumed that a minimum value of an expected leakage resistance is $100\Omega$ and the potential difference that may be differentiated from the earth fault is 1 V, the constant current value of the discharge type constant current circuit 7 is 10 mA by the Ohm's Law. In this embodiment, the discharge type constant current circuit 7 is used to cause the constant current to flow, and hence even when the leakage from the armature windings of the polyphase dynamo-electric machine 4 to the cathode potential of the DC power supply 3 due to salt water or mud water occurs, it is possible to avoid falsely determining the earth fault.

A description is given of a method of setting a resistance value of the pull-down resistors 9. The resistance value of the pull-down resistors 9 is set in consideration of the fact that the phase voltages of the polyphase dynamo-electric machine 4 increase up to an anode voltage of the DC power supply 3 due to a power fault of an armature winding of the polyphase dynamo-electric machine 4 or a short circuit fault of a power semiconductor switching element 2 constituting an upper arm. More specifically, for example, in a case where a rated power of the pull-down resistors 9 is represented by P, a safety factor such as a temperature derating is represented by $\alpha$ (for example, 0.7 or 0.8), and a maximum value of a voltage fluctuation range of the DC power supply 3 in which the power conversion device 1 operates normally is represented by Batt(MAX), the resistance value Rpd of the pull-down resistors 9 needs to satisfy Expression 1 below.

$$Rpd > Batt(MAX)^2/(P \times \alpha) \qquad \text{(Expression 1)}$$

In addition, in an off state of the power semiconductor switching elements 2, a leakage current flows from the driving circuit 5 to the AC terminals of the armature windings of the polyphase dynamo-electric machine 4, and hence there is a need to avoid a phenomenon in which the leakage current increases potentials of both terminals of the pull-down resistors 9 and stops a flow of a minute current which flows so as to detect a fault in the polyphase dynamo-electric machine 4. Therefore, in a case where the leakage current per phase from the driving circuit 5 is represented by im, the number of phases is represented by n, an output voltage of the internal power supply circuit 6 is represented by Vcc, and a voltage drop in a forward direction of the backflow prevention diode 8 is represented by Vf, the resistance value Rpd of the pull-down resistors 9 needs to satisfy Expression 2 below.

$$Rpd < (Vcc - Vf)/(im \times n/(n-1)) \qquad \text{(Expression 2)}$$

The fault determination unit 11 includes, for example, a logic circuit such as a microcomputer or an ASIC, or a comparing unit such as a comparator. The fault determination unit 11 starts a fault determination in a state in which all the power semiconductor switching elements 2 are in the off state and no induction voltage is generated in the armature windings of the polyphase dynamo-electric machine 4, and when a fault determination start signal is received from a control unit (not shown) of the power conversion device 1 or a host controller (not shown) of the power conversion device 1. At the time of the fault determination, the fault determination unit 11 uses the internal power supply circuit 6 to cause the minute current to flow through the armature windings of the polyphase dynamo-electric machine 4, and detects the phase voltages to perform the fault determination based on the detected phase voltages. Operation of the fault determination is described below with reference to a flow chart illustrated in FIG. 2.

Figure 2:
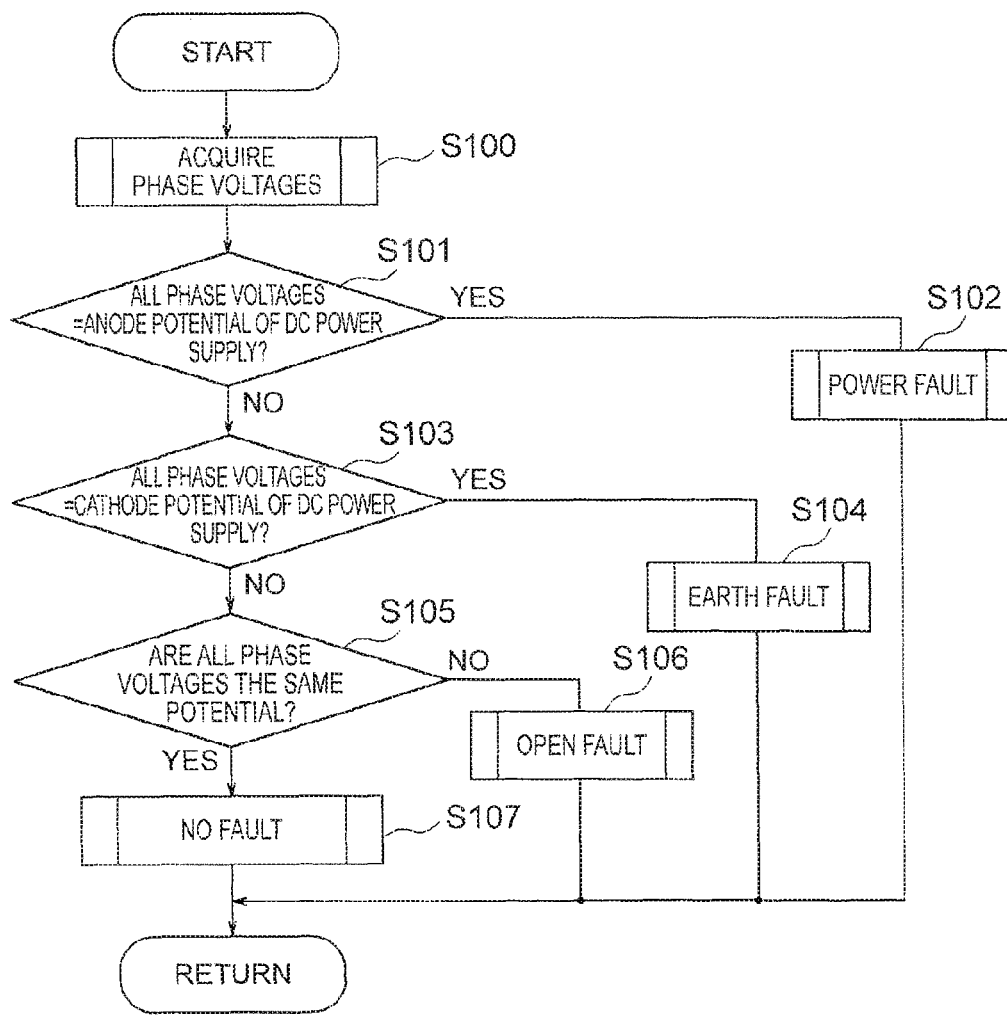
FIG. 2 is a flow chart illustrating operation of a fault determination unit 11 in the power conversion device according to the first embodiment of the present invention.

First, as illustrated in FIG. 2, in Step S100, all the phase voltages of the armature windings of the polyphase dynamo-electric machine 4 are acquired from the phase voltage detection units 10. Next in Step S101, it is determined whether or not all the phase voltages are substantially equal to the anode potential of the DC power supply 3, and when all the phase voltages are substantially equal to the anode potential, the processing transitions to Step S102. In Step S102, the power fault is determined, and the fault determination processing is ended. Note that, the term "substantially" as used in Step S101 means that, even when the detection errors of the phase voltage detection units 10 are subtracted, the phase voltages are equal to the anode potential of the DC power supply 3. On the other hand, in a case where all the phase voltages are not substantially the anode potential of the DC power supply 3 in Step S101, the processing proceeds to Step S103. In Step S103, it is determined whether or not all the phase voltages are substantially equal to the cathode potential of the DC power supply 3, and when all the phase voltages are substantially equal to the cathode potential, the processing transitions to Step S104. In Step S104, the earth fault is determined, and the fault determination processing is ended. On the other hand, in a case where all the phase voltages are not substantially the cathode potential of the DC power supply 3 in Step S103, the processing proceeds to Step S105. In Step S105, when all the phase voltages are not substantially the same potential, the processing transitions to Step S106. In Step S106, the open fault is determined, and the fault determination processing is ended. On the other hand, when all the phase voltages are substantially the same potential in Step S105, the processing proceeds to Step S107, and in Step S107, it is determined that none of the power fault, the earth fault, and the open fault has occurred in the polyphase dynamo-electric machine 4, and the fault determination processing is ended.

Note that, in order to realize the fault determination method described in FIG. 2 without a false determination, it is required that a value of the predetermined voltage output by the internal power supply circuit 6 be set to a value smaller than a minimum value of the voltage fluctuation range of the DC power supply 3 in which the power conversion device 1 operates normally.

Figure 3:
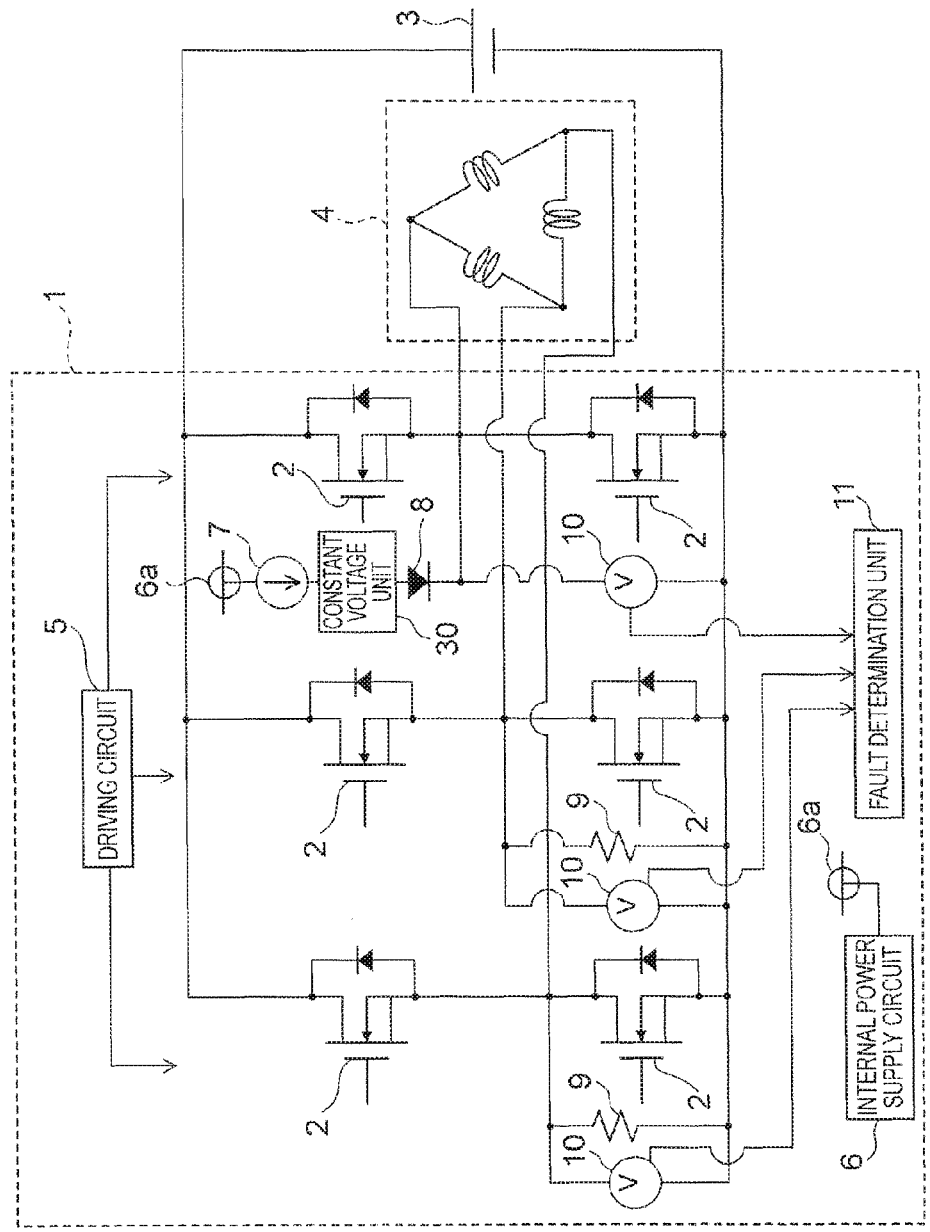
FIG. 3 is a block diagram illustrating a configuration of a modified example of the power conversion device according to the first embodiment of the present invention.

Moreover, FIG. 3 illustrates a modified example of FIG. 1, and in FIG. 3, a constant voltage unit 30 is connected in series with the backflow prevention diode 8. The constant voltage unit 30 is provided between the discharge type constant current circuit 7 and the backflow prevention diode 8. The other components are the same as in FIG. 1, and hence a description thereof is omitted here.

The constant voltage unit 30 increases (or amplifies) the potential difference between the output voltage of the internal power supply circuit 6 and the phase voltages of the armature windings of the polyphase dynamo-electric machine 4. The constant voltage unit 30 includes, for example, a constant voltage diode having a cathode side connected to the output terminal 6a of the internal power supply circuit 6. Alternatively, the constant voltage unit 30 may include at least one diode, and a voltage drop in the forward direction of the at least one diode may be utilized to connect an anode side of the at least one diode to the output terminal 6a of the internal power supply circuit 6. In the state in which all the power semiconductor switching elements 2 are in the off state and no induction voltage is generated in the armature windings of the polyphase dynamo-electric machine 4, and at the time of no fault, the values of the phase voltages are decreased. Therefore, the constant voltage unit 30 is provided to increase the potential difference between the output voltage of the internal power supply circuit 6 and the phase voltages of the armature windings of the polyphase dynamo-electric machine 4, with the result that even when the anode potential of the DC power supply 3 is lower than a value of the output voltage of the internal power supply circuit 6, the power fault can be detected precisely.

As described above, according to the first embodiment, in the state in which all the power semiconductor switching elements 2 are in the off state and no induction voltage is generated in the armature windings of the polyphase dynamo-electric machine 4, the internal power supply circuit 6 is used to cause the minute current to flow through the armature windings of the polyphase dynamo-electric machine 4, and the respective phase voltages are detected by the phase voltage detection units 10 so that the fault determination is performed based on the detected phase voltages, with the result that the power, earth, and open faults of the polyphase dynamo-electric machine 4 can be detected accurately.

Moreover, the discharge type constant current circuit 7 is used to cause the constant current to flow, with the result that even when the leakage from the armature windings of the polyphase dynamo-electric machine 4 to the cathode potential of the DC power supply 3 due to salt water or mud water occurs, it is possible to avoid falsely determining the earth fault.

Further, the resistance value of the pull-down resistors 9 is selected appropriately, with the result that it is possible to prevent the problem in that the leakage current from the driving circuit 5 stops the minute current for detecting the fault from flowing through the polyphase dynamo-electric machine 4, and even when a power fault occurs in an armature winding of the polyphase dynamo-electric machine 4 or a short circuit fault occurs in a power semiconductor switching element 2 constituting an upper arm of a phase bridge circuit, there is no fear that a pull-down resistor 9 is burned by exceeding the rating so that a secondary fault can be prevented.

In addition, the output voltage of the internal power supply circuit 6 is set to the value smaller than the minimum value of the voltage fluctuation range of the DC power supply 3 in which the power conversion device 1 operates normally, with the result that the fault determination processing can be realized without a false determination.

Moreover, with the addition of the constant voltage unit 30 to decrease the phase voltage value at the time of no fault as in the modified example illustrated in FIG. 3, even when the anode potential of the DC power supply 3 is lower than the output voltage of the internal power supply circuit 6, the power fault can be detected precisely.

Second Embodiment

Figure 4:
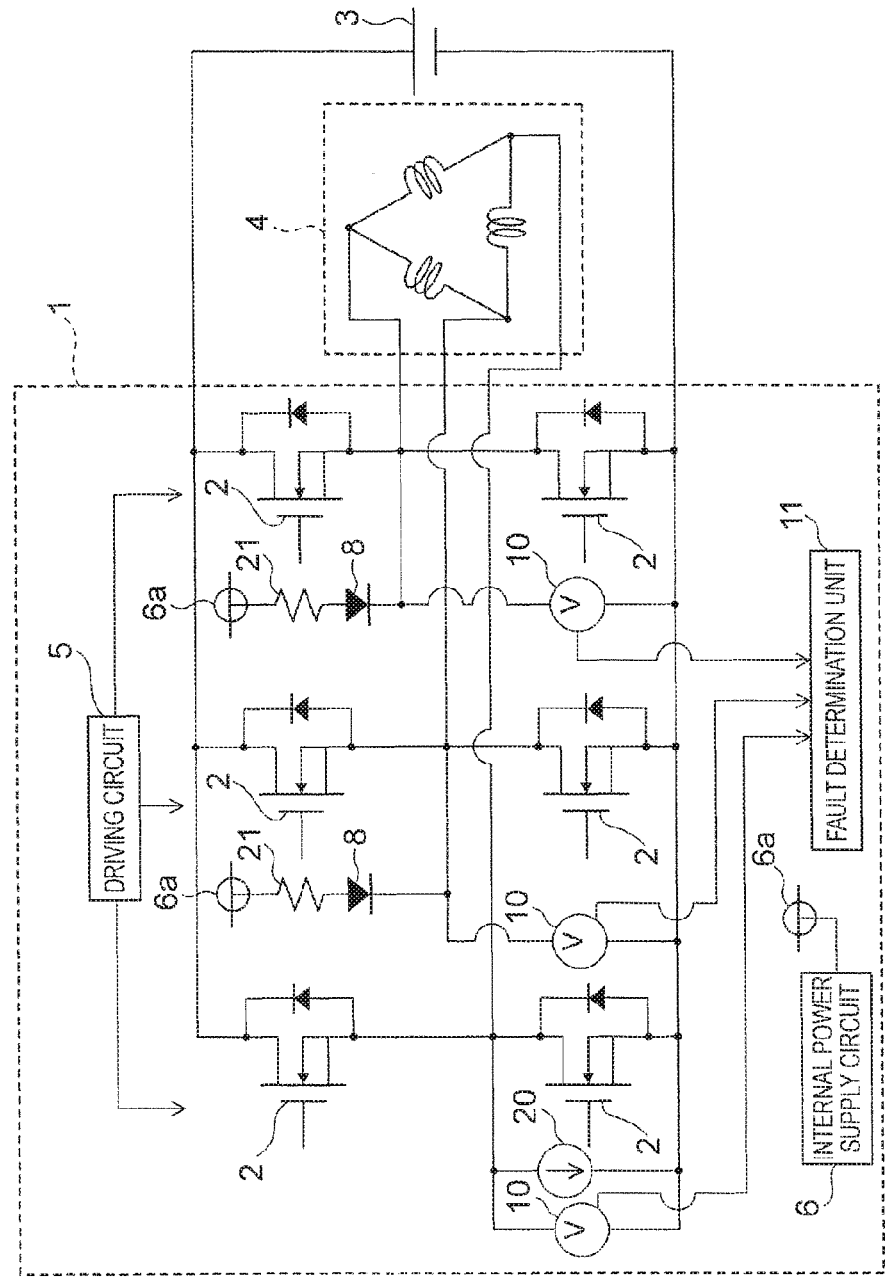
FIG. 4 is a block diagram illustrating a configuration of a power conversion device according to a second embodiment of the present invention.

FIG. 4 illustrates a configuration of a power conversion device according to a second embodiment of the present invention. Compared to the first embodiment illustrated in FIG. 1, differences reside in that, in FIG. 4, a sink type constant current circuit 20 is connected between an arbitrary one of the AC terminals of the armature windings of the polyphase dynamo-electric machine 4 and the cathode potential of the DC power supply 3, the other two AC terminals of the armature windings of the polyphase dynamo-electric machine 4 are connected to the output terminal 6a of the internal power supply circuit 6 via pull-up resistors 21 and the backflow prevention diodes 8, and the pull-down resistors 9 in FIG. 1 are not provided. The other components and operation are the same as in FIG. 1, and hence a description thereof is omitted here.

Note that, operation of the fault determination unit 11 in this embodiment is the same as the processing of the flow chart of FIG. 2 described above in the first embodiment, and hence a description thereof is omitted here.

The sink type constant current circuit 20 includes, as with the discharge type constant current circuit 7 illustrated in FIG. 1, for example, a constant current diode, or a constant current circuit using transistors, such as a current mirror circuit. As a method of setting a constant current value of the sink type constant current circuit 20, similar to the discharge type constant current circuit 7 described above, there needs to be such a potential difference that the phase voltages and the anode potential of the DC power supply 3 may be differentiated in the case where the leakage from the armature windings of the polyphase dynamo-electric machine to the anode potential of the DC power supply due to salt water or mud water occurs. For example, in the case where it is assumed that the minimum value of the expected leakage resistance is 100Ω and the potential difference that may be differentiated from the power fault is 1 V, the constant current value is 10 mA by the Ohm's Law.

Moreover, in the off state of the power semiconductor switching elements 2, the leakage current flows from the driving circuit 5 to the AC terminals of the armature windings of the polyphase dynamo-electric machine 4, and hence the constant current value of the sink type constant current circuit 20 needs to be set at least larger than the leakage current. Otherwise, the leakage current flows to the DC power supply 3 through body diodes of the power semiconductor switching elements 2 and the phase voltages become equal to or larger than the anode potential of the DC power supply 3, which causes the fault determination unit 11 to falsely determine the power fault. Therefore, the constant current value icd may be set as Expression 3 below, for example, by adding the leakage current to the constant current value calculated from the potential difference VL required at the time of the leakage to the anode potential of the DC power supply 3 and the minimum value RL of the expected leakage resistance. Note that, the leakage current per phase from the driving circuit 5 is represented by im, and the number of phases is represented by n.

$$icd = VL/RL + im \times n \quad \text{(Expression 3)}$$

On the other hand, as with the constant voltage unit 30 illustrated in FIG. 3, the pull-up resistors 21 have the role of decreasing the phase voltages. When a resistance value of the pull-up resistors 21 is set too large, a constant current of the sink type constant current circuit 20 causes a voltage between both terminals of the pull-up resistors 21 to become too large, and the phase voltages are decreased to near the cathode potential of the DC power supply 3. Therefore, in order to avoid such circumstance, when the output voltage of the internal power supply circuit 6 is represented by Vcc, the voltage drop in the forward direction of the backflow prevention diodes 8 is represented by Vf, and the constant current value of the sink type constant current circuit 20 is represented by icd, the resistance value Rpu of the pull-up resistors 21 needs to satisfy Expression 4 below.

$$Rpu < (Vcc - Vf)/icd \quad \text{(Expression 4)}$$

Moreover, in a case where an open circuit occurs in an AC terminal of the armature windings of the polyphase dynamo-electric machine 4 to which a pull-up resistor 21 is connected, a rated power of the pull-up resistors 21 needs to be a rated power capable of withstanding even a maximum constant current value of the sink type constant current circuit 20 with one pull-up resistor 21. Therefore, with the rated power of the pull-up resistors 21 being represented by P, a safety factor such as a temperature derating being represented by α (for example, 0.7 or 0.8), and the constant current value of the sink type constant current circuit 20 being represented by icd, the resistance value Rpu of the pull-up resistors 21 needs to satisfy Expression 5 below.

$$Rpu < (P \times \alpha)/icd^2 \quad \text{(Expression 5)}$$

In addition, by setting the resistance value of the pull-up resistors 21 to be, for example, as large as about three to four times the expected minimum value of the leakage resistance, which occurs due to salt water or mud water, even when salt water or mud water causes the leakage in the armature windings of the polyphase dynamo-electric machine 4 to the anode potential or the cathode potential of the DC power supply 3, it is possible for the fault determination unit 11 to avoid falsely determining the power fault and the earth fault.

As described above, according to the second embodiment, as in the first embodiment described above, in the state in which all the power semiconductor switching elements 2 are in the off state and no induction voltage is generated in the armature windings of the polyphase dynamo-electric machine, the internal power supply circuit 6 may be used to cause the minute current to flow through the armature windings of the polyphase dynamo-electric machine 4, and the fault determination may be performed based on each of the phase voltages, with the result that the power fault, the earth fault, and the open fault of the polyphase dynamo-electric machine 4 can be detected accurately.

Moreover, the sink type constant current circuit 20 is used to cause the constant current to flow, with the result that even when the leakage from the armature windings of the polyphase dynamo-electric machine 4 to the anode potential of the DC power supply 3 due to salt water or mud water occurs, it is possible to avoid falsely determining the power fault.

Further, the resistance value of the pull-up resistors 21 is selected appropriately, with the result that it is possible to avoid falsely determining the power fault and the earth fault even for the leakage from the armature windings of the polyphase dynamo-electric machine 4 to the anode potential or the cathode potential of the DC power supply 3 due to salt water or mud water.

In addition, the resistance value of the pull-up resistors 21 is selected appropriately, with the result that even when the anode potential of the DC power supply 3 is lower than the output voltage of the internal power supply circuit 6, the power fault may be detected accurately.

Third Embodiment

Figure 5:
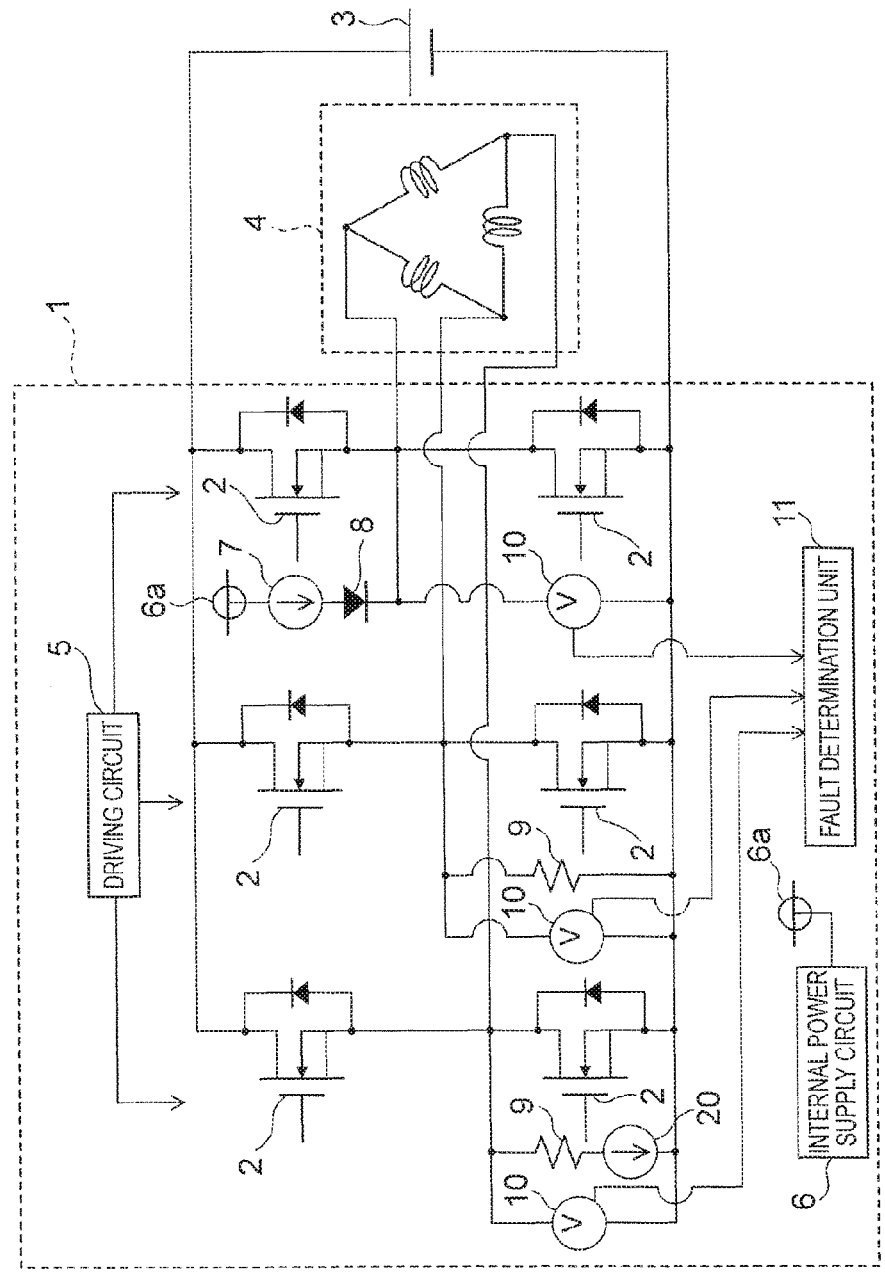
FIG. 5 is a block diagram illustrating a configuration of a power conversion device according to a third embodiment of the present invention.

FIG. 5 illustrates a configuration of a power conversion device according to a third embodiment of the present invention. Compared to the first embodiment illustrated in FIG. 1, a difference resides in that a sink type constant current circuit 20 is connected in series with an arbitrary one of the pull-down resistors 9. The other components and operation are the same as in the first embodiment, and hence a description thereof is omitted here.

Note that, operation of the fault determination unit 11 in this embodiment is the same as the processing of the flow chart of FIG. 2 described above in the first embodiment, and hence a description thereof is omitted here.

The constant current value of the discharge type constant current circuit 7 may be set in the same manner as in the first embodiment described above, and it is possible to avoid falsely determining the earth fault even for the leakage from the armature windings of the polyphase dynamo-electric machine 4 to the cathode potential of the DC power supply 3 due to salt water or mud water. Similarly, the constant current value of the sink type constant current circuit 20 may also be set in the same manner as in the second embodiment described above, and it is possible to avoid falsely determining the power fault even for the leakage from the armature windings of the polyphase dynamo-electric machine 4 to the anode potential of the DC power supply 3 due to salt water or mud water.

Note that, the resistance value of the other pull-down resistor 9 which is not connected in series with the sink type constant current circuit 20 may be selected to satisfy Expressions 1 and 2 described above.

The pull-down resistor 9 which is connected in series with the sink type constant current circuit 20 has the role of adjusting the phase voltage similar to the constant voltage unit 30 illustrated in FIG. 3. More specifically, in the state in which all the power semiconductor switching elements 2 are in the off state and no induction voltage is generated in the armature windings of the polyphase dynamo-electric machine 4, with the phase voltage being represented by Vu, the constant current value of the discharge type constant current circuit 7 being represented by icu, and the resistance value of the pull-down resistor 9 which is not connected in series with the sink type constant current circuit 20 being represented by Rpdn, a resistance value Rpd1 of the pull-down resistor 9 which is connected in series with the sink type constant current circuit 20 may be determined using Expression 6 below.

$$Rpd1=(Rpdn \times icu-Vu)/(Rpdn \times Vu) \quad \text{(Expression 6)}$$

Moreover, the resistance value of the pull-down resistor 9 which is connected in series with the sink type constant current circuit 20 needs to be selected so as not to limit the current that flows to the sink type constant current circuit 20 when the leakage from the armature windings of the polyphase dynamo-electric machine 4 to the anode potential of the DC power supply 3 due to salt water or mud water occurs. More specifically, with the minimum value of the voltage fluctuation range of the DC power supply 3 in which the power conversion device 1 operates normally being represented by Batt(MIN), the constant current value of the sink type constant current circuit 20 being represented by icd, and the minimum value of the expected leakage resistance being represented by RL, the resistance value Rpd1 of the pull-down resistor 9 needs to satisfy Expression 7 below.

$$Rpd1<Batt(MIN)/icd-RL \quad \text{(Expression 7)}$$

As described above, according to the third embodiment, similar to the first embodiment described above, in the state in which all the power semiconductor switching elements 2 are in the off state and no induction voltage is generated in the armature windings of the polyphase dynamo-electric machine 4, the internal power supply circuit 6 is used to cause the minute current to flow through the armature windings of the polyphase dynamo-electric machine 4, and the fault determination is performed based on each of the phase voltages, with the result that the power fault, the earth fault, and the open fault of the polyphase dynamo-electric machine 4 can be detected accurately.

Moreover, the sink type constant current circuit 20 is used to cause the constant current to flow, with the result that even for the leakage from the armature windings of the polyphase dynamo-electric machine 4 to the cathode potential of the DC power supply 3 due to salt water or mud water, it is possible to avoid falsely determining the earth fault.

Moreover, the discharge type constant current circuit 7 is used to cause the constant current to flow, with the result that even for the leakage from the armature windings of the polyphase dynamo-electric machine 4 to the cathode potential of the DC power supply 3 due to salt water or mud water, it is possible to avoid falsely determining the earth fault.

In addition, the resistance value of the pull-down resistor 9 which is connected in series with the sink type constant current circuit 20 is selected appropriately, with the result that the power fault can be detected precisely even when the anode potential of the DC power supply 3 is lower than the output voltage of the internal power supply circuit 6.

Note that, in the above description, a description has been given of a method in which, one of the AC terminals of the armature windings of the polyphase dynamo-electric machine 4, namely the AC terminal which is connected to neither the discharge type constant current circuit 7 nor the sink type constant current circuit 20, is connected to the cathode potential of the DC power supply 3 via the pull-down resistor 9. However, the present invention is not limited thereto. Therefore, the one of the AC terminals of the armature windings of the polyphase dynamo-electric machine 4, namely the AC terminal which is connected to neither the discharge type constant current circuit 7 nor the sink type constant current circuit 20, may be connected to the output terminal 6a of the internal power supply circuit 6 via the pull-up resistor 21 and the backflow prevention diode 8 similar to the second embodiment described above, and also in that case, it is possible to obtain similar effects. Note that, the pull-up resistors 21 in FIG. 4 are mounted for the purpose of detecting the open fault. More specifically, when an open fault occurs in the AC terminal of the armature windings of the polyphase dynamo-electric machine 4 which is connected to the pull-up resistor 21, since the open fault is determined based on the fact that the phase voltage of the AC terminal becomes the output voltage of the internal power supply circuit 6, the magnitude of a value of a current that flows through the pull-up resistor 21 does not matter. However, when a resistance value of the pull-up resistor 21 is small, the setting of the phase voltages of the pull-down resistors 9 and the setting of the constant current value of the discharge type constant current circuit 7 are affected. Therefore, the resistance value is set to be sufficiently larger than that of the pull-down resistor 9, and it is preferred to use the resistance value of several kΩ to several tens of kΩ, for example.

Moreover, the resistance value Rpd1 of the pull-down resistor 9 which is connected in series with the sink type constant current circuit 20 may be determined using Expression 8 below, instead of Expression 6 described above.

$$Rpd1=Vu/icd \quad \text{(Expression 8)}$$

Fourth Embodiment

Figure 6:
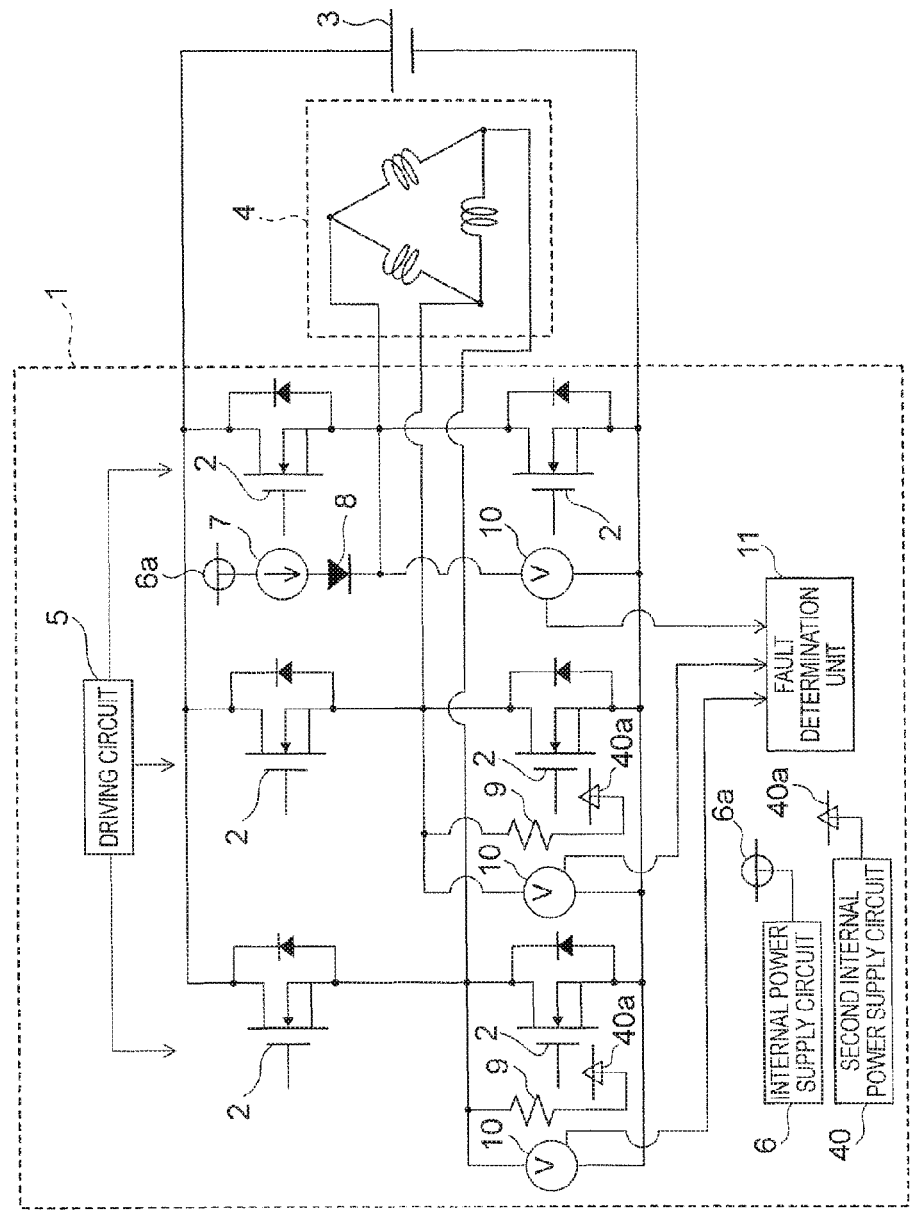
FIG. 6 is a block diagram illustrating a configuration of a power conversion device according to a fourth embodiment of the present invention.

FIG. 6 illustrates a configuration of a power conversion device according to a fourth embodiment of the present invention. Compared to the first embodiment illustrated in FIG. 1, differences reside in that, in FIG. 6, a second internal power supply circuit 40 for outputting a voltage that is smaller than the output voltage of the internal power supply circuit 6 is added, and the pull-down resistors 9 connect the AC terminals of the armature windings of the polyphase dynamo-electric machine 4 and an output terminal 40a of the second internal power supply circuit 40. The other components and operation are the same as in FIG. 1.

The second internal power supply circuit 40 is provided to detect an occurrence of a combined fault such as when a power fault occurs in an armature winding of the polyphase dynamo-electric machine 4 and at the same time an open fault occurs. The second internal power supply circuit 40 includes, for example, a DC-DC converter, a series regulator, or a constant voltage diode. The output voltage of the second internal power supply circuit 40 is set to be a value that is lower than the output voltage of the internal power supply circuit 6. More specifically, it is possible to adopt a method of setting the output voltage of the second internal power supply circuit 40 to, for example, a value that is equal to or lower than the potential difference required at the time of occurrence of the leakage from the armature windings of the polyphase dynamo-electric machine 4 to the cathode potential of the DC power supply 3 due to salt water or mud water. In other words, the output voltage of the second internal power supply circuit 40 is lower than the phase voltage value in the state in which all the power semiconductor switching elements 2 are in the off state and no induction voltage is generated in the armature windings of the polyphase dynamo-electric machine 4 and at the time of no fault, and the method of setting the constant current of the discharge type constant current circuit 7, which is described in the first embodiment, can be used directly without causing a current to flow from the output voltage of the second internal power supply circuit 40 to the AC terminals of the armature windings of the polyphase dynamo-electric machine 4, with the result that similar effects to those of the first embodiment may be obtained. Moreover, the resistance value of the pull-down resistors 9 can be calculated by means of computation in which the output voltage of the second internal power supply circuit 40 is subtracted from the output voltage Vcc of the internal power supply circuit 6 in Expressions 1 and 2 described above or the anode potential of the DC power supply 3, with the result that similar effects to those of the first embodiment may be obtained.

Figure 7:
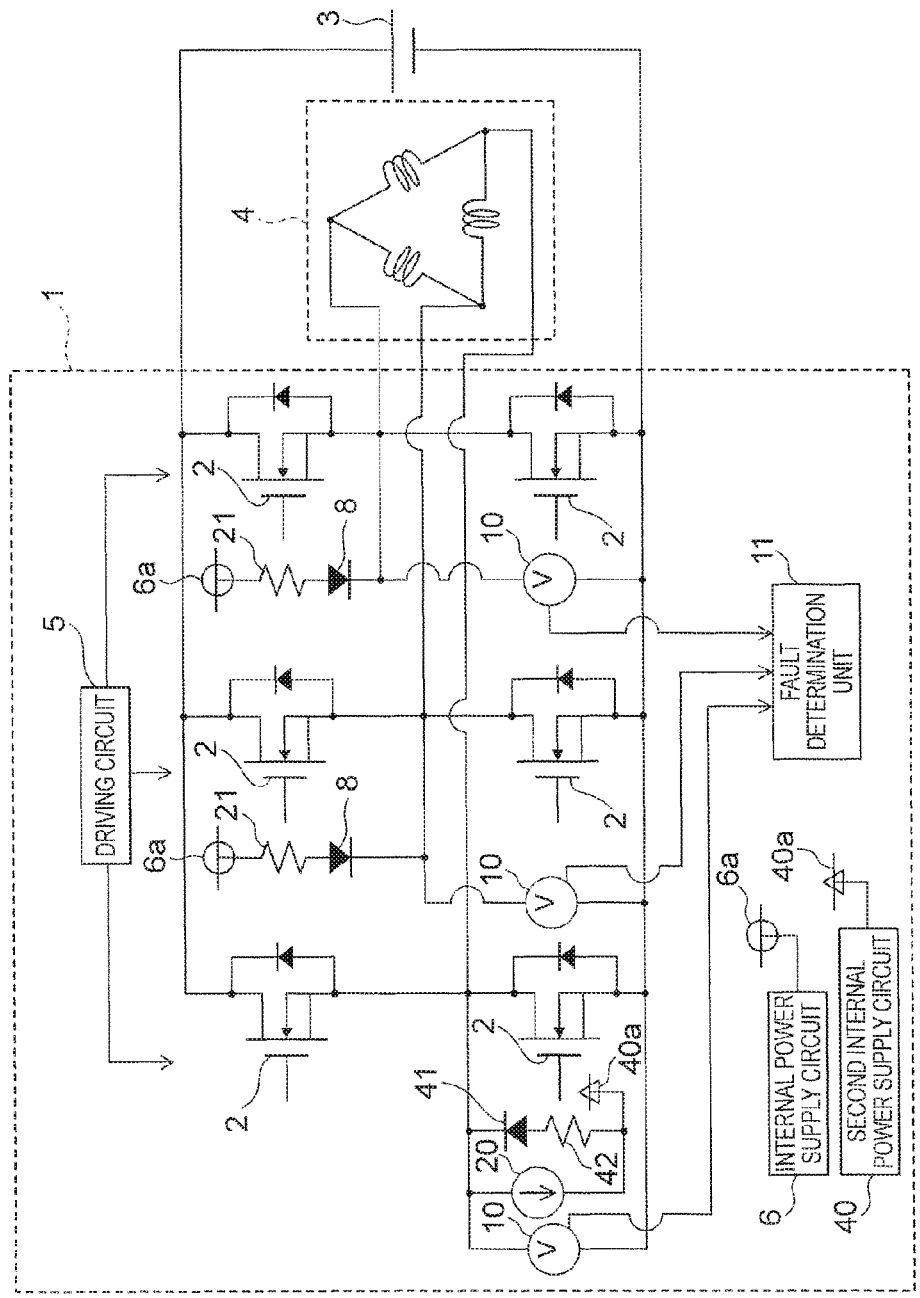
FIG. 7 is a block diagram illustrating a configuration of a modified example of the power conversion device according to the fourth embodiment of the present invention.

Note that, FIG. 7 illustrates a modified example of the power conversion device according to the fourth embodiment of the present invention. Compared to the second embodiment illustrated in FIG. 4, differences reside in that, in FIG. 7, the second internal power supply circuit 40, a diode 41, and a resistor 42 are added, and the sink type constant current circuit 20 connects an AC terminal of the armature windings of the polyphase dynamo-electric machine 4 and the output terminal 40a of the second internal power supply circuit 40. The other components and operation are the same as in FIG. 4.

Note that, in FIG. 7, the second internal power supply circuit 40 outputs the voltage that is smaller than the output voltage of the internal power supply circuit 6. The diode 41 and the resistor 42 are connected in parallel to the sink type constant current circuit 20. The diode 41 prevents a current from flowing from the AC terminal of the armature windings of the polyphase dynamo-electric machine 4 to the output terminal 40a of the second internal power supply circuit 40. The resistor 42 has the role of limiting the current that flows from the output terminal 40a of the second internal power supply circuit 40 to the cathode potential of the DC power supply 3, when an earth fault occurs in an AC terminal of the armature windings of the polyphase dynamo-electric machine 4.

In FIG. 7 also, the output voltage of the second internal power supply circuit 40 may be set to the value that is lower than the output voltage of the internal power supply circuit 6. More specifically, for example, it is possible to adopt the method of setting the output voltage of the second internal power supply circuit 40 to the value that is equal to or lower than the potential difference required at the time of occurrence of the leakage from the armature windings of the polyphase dynamo-electric machine 4 to the cathode potential of the DC power supply 3 due to salt water or mud water. In other words, the output voltage of the second internal power supply circuit 40 is lower than the phase voltage value in the state in which all the power semiconductor switching elements 2 are in the off state and no induction voltage is generated in the armature windings of the polyphase dynamo-electric machine 4 and at the time of no fault. Moreover, the method of setting the constant current of the sink type constant current circuit 20, which is described in the second embodiment, can be used directly without causing the current to flow from the output voltage of the second internal power supply circuit 40 to the AC terminals of the armature windings of the polyphase dynamo-electric machine 4, with the result that similar effects to those of the second embodiment can be obtained. Moreover, as to setting of a constant of the pull-up resistors 21, the resistance value can be calculated by means of computation in which the output voltage of the second internal power supply circuit 40 is subtracted from the output voltage Vcc of the internal power supply circuit 6 in Expression 4 described above, with the result that similar effects to those of the second embodiment can be obtained.

Next, a description is given of the fault determination processing of the fault determination unit 11 in the configuration of each of FIGS. 6 and 7 with reference to a flow chart of FIG. 8. The fault determination unit 11 includes, for example, a logic circuit such as a microcomputer or an ASIC, or a comparing unit such as a comparator. In this embodiment also, the fault determination unit 11 starts the fault determination in the state in which all the power semiconductor switching elements 2 are in the off state and no induction voltage is generated in the armature windings of the polyphase dynamo-electric machine 4, and when the fault determination start signal is received from the control unit (not shown) of the power conversion device 1 or the host controller (not shown) of the power conversion device 1. At the time of the fault determination, the fault determination unit 11 uses the internal power supply circuit 6 and the second internal power supply circuit 40 to cause the minute current to flow through the armature windings of the polyphase dynamo-electric machine 4, and detects the phase voltages to perform the fault determination based on the detected phase voltages.

First, Step S100 of FIG. 8 is similar to Step S100 of FIG. 2, and the phase voltages of the armature windings of the polyphase dynamo-electric machine 4 are acquired from the phase voltage detection units 10. Next in Step S201, it is determined whether each of the phase voltages is substantially equal to the output voltage of the internal power supply circuit 6 or substantially equal to the output voltage of the second internal power supply circuit 40. As a result of the determination, in a case where at least one of the phase voltages is substantially equal to one of the output voltage of the internal power supply circuit 6 and the output voltage of the second internal power supply circuit 40, the processing transitions to Step S202. In Step S202, an open fault flag is set to the phase, and the processing proceeds to Step S203. On the other hand, in a case where all the phase voltages are different from the output voltage of the internal power supply circuit 6 or different from the output voltage of the second internal power supply circuit 40 in Step S201, the processing proceeds to Step S203. In Step S203, it is determined whether or not each of the phase voltages is substantially equal to the anode potential of the DC power supply 3. As a result of the determination, in a case where at least one of the phase voltages is substantially equal to the anode potential of the DC power supply 3, the processing proceeds to Step S204. In Step S204, a power fault flag is set to the phase, and the processing proceeds to Step S205. On the other hand, in a case where all the phase voltages are substantially different from the anode potential of the DC power supply 3 in Step S203, the processing proceeds to Step S205. In Step S205, it is determined whether or not each of the phase voltages is substantially equal to the cathode potential of the DC power supply 3. As a result of the determination, in a case where at least one of the phase voltages is substantially equal to the cathode voltage of the DC power supply 3, the processing proceeds to Step S206. In Step S206, an earth fault flag is set to the phase, and the fault determination processing is ended. On the other hand, in a case where all the phase voltages are substantially different from the cathode potential of the DC power supply 3 in Step S205, the processing proceeds to Step S107. In Step S107, similar to Step S107 of FIG. 2, it is determined that no fault has occurred, and the fault determination processing is ended. Moreover, by checking the flag set in Steps S202, S204, and/or S206, it can be confirmed what fault has occurred in what phase, with the result that the power fault, the earth fault, and the open fault of the polyphase dynamo-electric machine 4 can be detected accurately, and a combined fault in which two or more of the above-mentioned faults have occurred simultaneously can also be detected.

As described above, according to the fourth embodiment, in the state in which all the power semiconductor switching elements 2 are in the off state and no induction voltage is generated in the armature windings of the polyphase dynamo-electric machine 4, the internal power supply circuit 6 and the second internal power supply circuit 40 are used to cause the minute current to flow through the armature windings of the polyphase dynamo-electric machine 4, and the fault determination is performed based on the respective phase voltages, with the result that the power fault, the earth fault, and the open fault of the polyphase dynamo-electric machine 4 can be detected accurately.

Moreover, the second internal power supply circuit 40 is newly provided, and one or more of the AC terminals of the armature windings of the polyphase dynamo-electric machine 4, namely the AC terminal(s) which is/are otherwise connected to the cathode potential of the DC power supply 3, is/are connected to the second internal power supply circuit 40, and the output voltage of the second internal power supply circuit 40 is set appropriately, with the result that the combined fault in which, for example, the open fault and the power fault of the armature windings of the polyphase dynamo-electric machine 4 occur simultaneously can also be detected.

Note that, in the configurations illustrated in FIGS. 6 and 7, the configurations in which the second internal power supply circuit 40 is newly provided to the configurations illustrated in FIGS. 1 and 4 have been described, respectively. However, the present invention is not limited thereto, and also for the configuration illustrated in FIG. 3 or 5, the second internal power supply circuit 40 may be newly provided, and one or more of the AC terminals of the armature windings of the polyphase dynamo-electric machine 4, namely the AC terminals which are otherwise connected to the cathode potential of the DC power supply 3, may be connected to the second internal power supply circuit 40, and the output voltage of the second internal power supply circuit 40 may be set appropriately, with the result that the combined fault in which, for example, the open fault and the power fault of the armature windings of the polyphase dynamo-electric machine 4 occur simultaneously may also be detected.

Fifth Embodiment

In the first to fourth embodiments described above, the description has been given of the method of using the fault determination unit 11 to determine the power fault, the earth fault, and the open fault of the armature windings of the polyphase dynamo-electric machine 4, including the short circuit fault of the power semiconductor switching elements 2 of the power conversion device 1. In this embodiment, a description is given of a method in which, after checking that no fault has occurred in the polyphase dynamo-electric machine 4 by the fault determination unit 11 in accordance with the flow chart of FIG. 2 or FIG. 8, a determination is further made on an inability to drive a power semiconductor switching element 2 of the power conversion device 1 in accordance with flow charts of FIGS. 9A and 9B. The inability to drive the power semiconductor switching element 2 includes a fault in which the power semiconductor switching element 2 cannot be turned on, and a fault in which the power semiconductor switching element 2 cannot be turned off.

Note that, the fifth embodiment may be applied to every fault determination unit 11 in the first to fourth embodiments, and similar effects may be obtained in any case of applying the fifth embodiment to any of the embodiments. Moreover, the operation other than operation illustrated in FIGS. 9A and 9B to be described below is the same as in the first to fourth embodiments, and hence a description thereof is omitted here. Note that, a configuration of the power conversion device in the fifth embodiment is the same as the configuration described in each of the first to fourth embodiments. Therefore, a description thereof is omitted here.

Figure 9A:
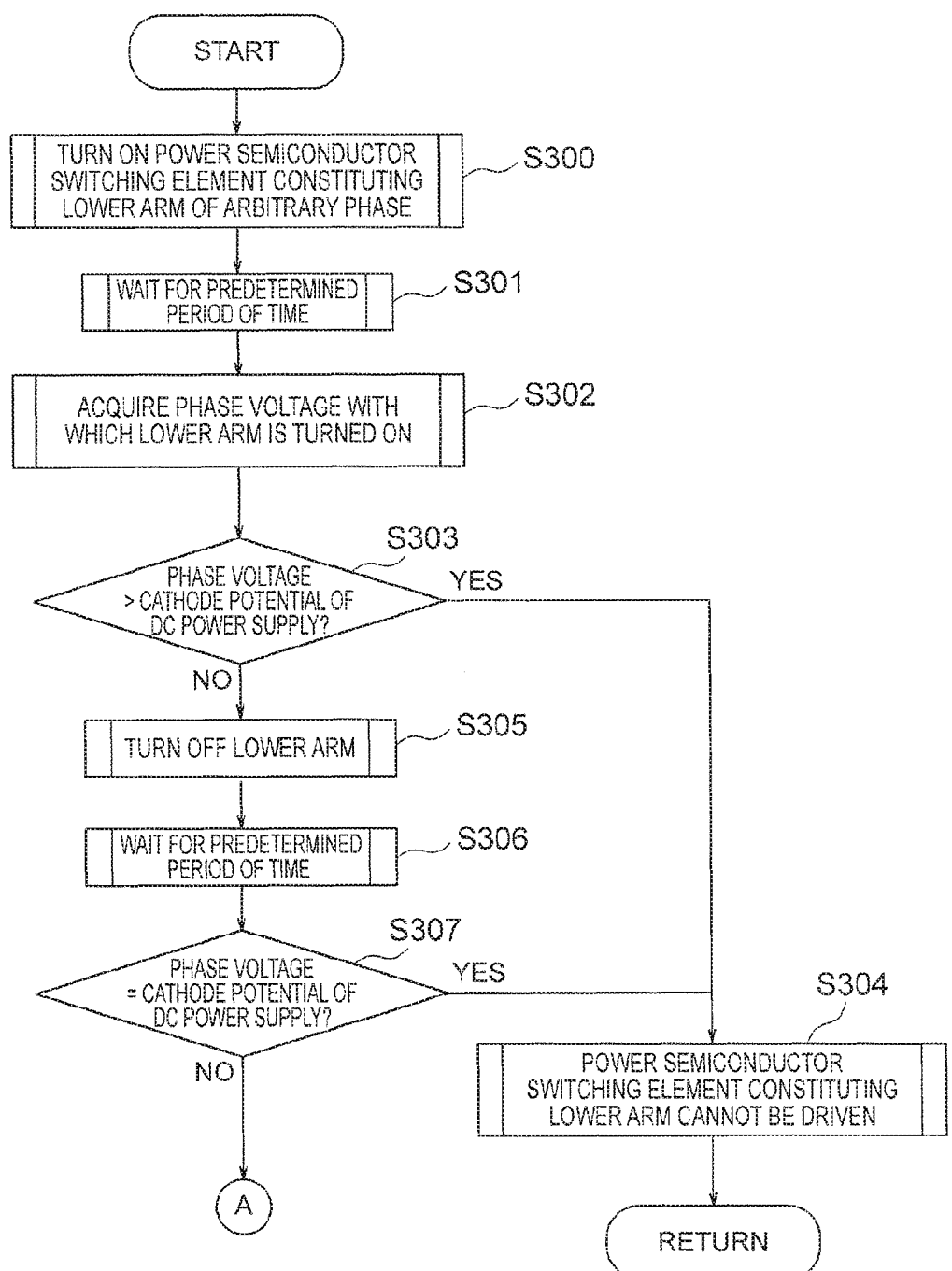
FIG. 9A is a flow chart illustrating operation of a fault determination unit 11 in a power conversion device according to a fifth embodiment of the present invention.

The operation of the fault determination unit 11 in this embodiment is described with reference to the flow charts of FIGS. 9A and 9B. As illustrated in FIG. 9A, in Step S300, the fault determination unit 11 turns on a power semiconductor switching element 2 constituting a lower arm of an arbitrary phase via the driving circuit 5. Then, a predetermined period of time is waited until the phase voltage stabilizes in Step S301, and the processing proceeds to Step S302. A method of setting the predetermined period of time is described in detail later. In Step S302, the phase voltage of the phase in which the power semiconductor switching element 2 is turned on is acquired via the phase voltage detection unit 10, and the processing proceeds to Step S303. In Step S303, it is determined whether or not the acquired phase voltage is substantially higher than the cathode potential of the DC power supply 3. As a result of the determination, when the acquired phase voltage is substantially higher, the processing proceeds to Step S304. In Step S304, it is determined that the fault in which the power semiconductor switching element 2 cannot be turned on has occurred and that the power semiconductor switching element 2 is unable to be driven, and the fault determination processing on the power semiconductor switching element 2 constituting the phase is ended. On the other hand, when the phase voltage is substantially equal to or lower than the cathode potential of the DC power supply 3 (in other words, when the phase voltage is substantially equal to the cathode potential) in Step S303, the processing proceeds to Step S305. In Step S305, the power semiconductor switching element 2 is turned off via the driving circuit 5, and the processing proceeds to Step S306. In Step S306, as in Step S301, the predetermined period of time is waited until the phase voltage stabilizes, and the processing proceeds to Step S307. In Step S307, when the phase voltage is substantially equal to the cathode potential of the DC power supply 3, the processing proceeds to Step S304. In Step S304, it is determined that the fault in which the power semiconductor switching element 2 cannot be turned off has occurred and that the power semiconductor switching element 2 is unable to be driven, and the fault determination processing on the power semiconductor switching element 2 constituting the phase is ended. On the other hand, when the phase voltage is not substantially equal to the cathode potential of the DC power supply 3 (in other words, when the phase voltage is higher than the cathode potential) in Step S307, the processing proceeds to Step S308 of FIG. 9B.

In Step S308, a power semiconductor switching element 2, which constructs an upper arm paired with the power semiconductor switching element 2 on which the fault determination has been performed in the processing of Steps S300 to S307, is turned on, and the processing proceeds to Step S309. In Step S309, similar to Step S301, the predetermined period of time is waited until the phase voltage stabilizes, and the processing proceeds to Step S310. In Step S310, the phase voltage with which the power semiconductor switching element 2 is turned on is acquired via the phase voltage detection unit 10, and the processing proceeds to Step S311. In Step S311, it is determined whether or not the acquired phase voltage is substantially lower than the anode potential of the DC power supply 3, and when the acquired phase voltage is substantially lower, the processing proceeds to Step S312. In Step S312, it is determined that the fault in which the power semiconductor switching element 2 cannot be turned on has occurred and that the power semiconductor switching element 2 is unable to be driven, and the fault determination processing on the power semiconductor switching element 2 constituting the phase is ended. On the other hand, when the phase voltage is substantially equal to or higher than the anode potential of the DC power supply 3 (in other words, when the phase voltage is substantially equal to the anode potential) in Step S311, the processing proceeds to Step S313. In Step S313, the power semiconductor switching element 2 is turned off via the driving circuit 5, and the processing proceeds to Step S314. In Step S314, similar to Step S301, the predetermined period of time is waited until the phase voltage stabilizes, and the processing proceeds to Step S315. In Step S315, it is determined whether or not the phase voltage is substantially equal to the anode potential of the DC power supply 3. As a result of the determination, in a case where the phase voltage is substantially equal to the anode potential, the processing transitions to Step S312. In Step S312, it is determined that the fault in which the power semiconductor switching element 2 cannot be turned off has occurred and that the power semiconductor switching element 2 is unable to be driven, and the fault determination processing on the power semiconductor switching element 2 constituting the phase is ended. On the other hand, when the phase voltage is not equal to the anode potential of the DC power supply 3 (in other words, when the phase voltage is lower than the anode potential) in Step S315, the processing proceeds to Step S316. In Step S316, it is determined that no fault has occurred in the power semiconductor switching elements 2 constituting the phase, and the processing is ended. The fault determination processing described above with reference to FIGS. 9A and 9B is performed for every phase of the armature windings of the polyphase dynamo-electric machine 4.

The predetermined period of time until the phase voltage stabilizes (hereinafter referred to as predetermined period of time Tm) in Steps S301, S306, S309, and S314 of FIGS. 9A and 9B is defined by Expression 9 below, for example, when wiring inductance from the DC power supply 3 to the power conversion device 1 is represented by Lm, a resistance value of the pull-down resistor 9 is represented by Rpd, a time constant of an LR circuit, which is determined by the inductance Lm and the resistance value Rpd, is represented by τ, and a proportion of the phase voltage to the anode potential of the DC power supply 3, on the basis of which the phase voltage is judged to be stable, is represented by β.

$$Tm \geq -\tau \times \ln(1-\beta), \text{ where } \tau = Lm/Rpd \qquad \text{(Expression 9)}$$

In other words, in a case where β=0.95, the predetermined period of time Tm needs to be about three times the time constant τ.

Moreover, when the predetermined period of time Tm until the phase voltage stabilizes is to be waited until all the phase voltages stabilize, the predetermined period of time Tm may be defined as Expression 10 below by using inductance Lp of the armature windings of the polyphase dynamo-electric machine 4, for example, in a case where the armature windings of the polyphase dynamo-electric machine 4 are in a star connection.

$$Tm \geq -(Lm+2\times Lp)/Rpd \times \ln(1-\beta) \qquad \text{(Expression 10)}$$

Note that, in FIGS. 9A and 9B, of the upper and lower arms constituting the phase bridge circuits, the fault determination processing is performed first on the lower arm. In particular, in a case where a bootstrap circuit is used as the driving circuit 5, there is a need to perform the fault determination processing first on the lower arm to charge a bootstrap capacitor.

As described above, according to the fifth embodiment, similar effects to those of the first to fourth embodiments may be obtained, and further, in the fifth embodiment, after it is checked that none of the power fault, the earth fault, and the open fault has occurred in the polyphase dynamo-electric machine 4, each of the power semiconductor switching elements 2 of the power conversion device 1 is further turned on and off to check whether the phase voltage has become a predetermined voltage, with the result that the inability to drive the power semiconductor switching elements 2 can be determined.

Moreover, after each one of the power semiconductor switching elements 2 of the power conversion device 1 is turned on and off, the predetermined period of time is waited until the phase voltage stabilizes, with the result that it is possible to prevent a phenomenon in which the fault of the inability to drive is falsely determined in a transition period of the phase voltage.

Further, of the upper and lower arms constituting the phase bridge circuits, the fault determination processing is performed first on the lower arm, with the result that in the case where the bootstrap circuit is used as the driving circuit 5, the bootstrap capacitor can be charged, and it is possible to avoid a phenomenon in which the upper arm cannot be turned on due to insufficient charge of the bootstrap capacitor.

Sixth Embodiment

Figure 10:
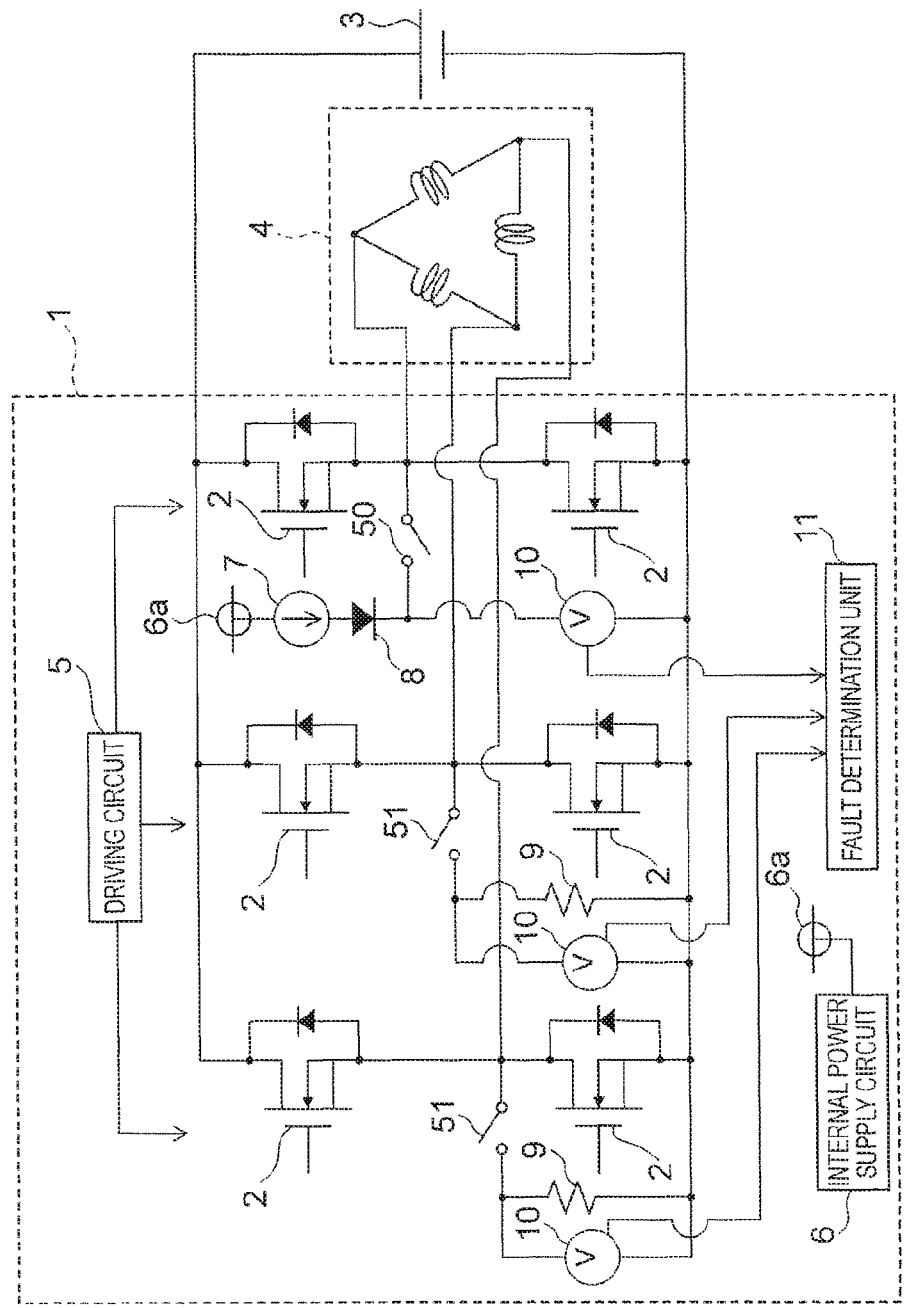
FIG. 10 is a block diagram illustrating a configuration of a power conversion device according to a sixth embodiment of the present invention.

FIG. 10 illustrates a configuration of a power conversion device according to a sixth embodiment of the present invention. Compared to the first embodiment illustrated in FIG. 1, a difference resides in that, in FIG. 10, a first switch unit 50 and two second switch units 51 are added. The first switch unit 50 is a switch for connecting or blocking a current path from the internal power supply circuit 6 to an AC terminal of armature windings of the polyphase dynamo-electric machine 4. The second switch units 51 are switches for connecting or blocking current paths from AC terminals of the armature windings of the polyphase dynamo-electric machine 4 to the cathode potential of the DC power supply 3. The first switch unit 50 and the second switch units 51 may specifically include, for example, semiconductor switches such as transistors or MOSFETs. The other components and operation are the same as in the first embodiment, and hence a description thereof is omitted here.

Then, the first switch unit 50 and the second switch units 51 are turned on before the fault determination is performed by the fault determination unit 11, and are turned off when the fault determination ends.

As described above, according to the sixth embodiment, similar effects to those of the first embodiment may be obtained, and further, the first switch unit 50 and the second switch units 51 are provided so that the first switch unit 50 and the second switch units 51 are turned on only when the fault determination processing is performed, which results in the effect that at times of a driving operation and a generating operation of the power conversion device 1, the minute current for the fault determination does not flow through the armature windings of the polyphase dynamo-electric machine 4, and hence there is no effect on the other abnormality detection circuits of the power conversion device 1.

Moreover, the minute current may be caused to flow from the internal power supply circuit 6 to the polyphase dynamo-electric machine 4 only when necessary, with the result that current consumption of the internal power supply circuit 6 may be suppressed.

As described above, as to the configuration of FIG. 10, a description has been given of the configuration in which the first switch unit 50 and the second switch units 51 are newly provided in the configuration of FIG. 1. However, the present invention is not limited thereto, and similar effects may be obtained also by newly providing the first switch unit 50 and the second switch units 51 to the configuration illustrated in each of FIGS. 3 to 5.

Note that, in the first to sixth embodiments described above, the fault determination unit 11 does not perform the fault determination when, in the state in which all the power semiconductor switching elements 2 are in the off state and no induction voltage is generated in the armature windings of the polyphase dynamo-electric machine 4, the anode potential of the DC power supply 3 is an AC terminal voltage of the armature windings of the polyphase dynamo-electric machine 4 or lower.

Moreover, in the first to sixth embodiments described above, the method of acquiring the anode potential of the DC power supply 3 may include, for example, a method involving adding a circuit similar to the phase voltage detection unit 10 to detect the anode voltage of the DC power supply 3, and a method involving acquiring by communication from the control unit (not shown) of the power conversion device 1 or the host controller (not shown) of the power conversion device 1.

As described above, in the first to sixth embodiments described above, in a case where the anode potential of the DC power supply 3 is equal to a predetermined value or lower, it is preferred not to perform the fault determination processing, with the result that it is possible to prevent the fault determination unit 11 from overlooking the power fault because the anode potential of the DC power supply 3 does not appear in the phase voltages although the power fault has occurred.

INDUSTRIAL APPLICABILITY

The present invention relates to the power conversion device 1 for supplying the electric power to the polyphase dynamo-electric machine 4 or rectifying the induction voltage from the polyphase dynamo-electric machine 4, in particular, the fault detection in the polyphase dynamo-electric machine and the power conversion device.

REFERENCE SIGNS LIST 1 power conversion device, 2 power semiconductor switching element, 3 power supply, 4 polyphase dynamo-electric machine, 5 driving circuit, 6 internal power supply circuit, 7 discharge type constant current circuit, 8 backflow prevention diode, 9 pull-down resistor, 10 phase voltage detection unit, 11 fault determination unit, 20 sink type constant current circuit, 21 pull-up resistor, 30 constant voltage unit, 40 second internal power supply circuit, 50 first switch unit, 51 second switch unit.

The invention claimed is:

1. A power conversion device, in which a plurality of phase bridge circuits each including power semiconductor switching elements, which are connected in series with each other to construct an upper arm and a lower arm, are connected in parallel to one another, both terminals of the plurality of phase bridge circuits are connected to a DC power supply, which is chargeable and dischargeable, and nodes between the power semiconductor switching elements of the upper arm and the lower arm of the plurality of phase bridge circuits are connected to AC terminals of armature windings of a polyphase dynamo-electric machine, for performing AC-DC power conversion or DC-AC power conversion, the power conversion device comprising:
an internal power supply circuit;
a driving circuit for turning on or off the power semiconductor switching elements;
a sink type constant current circuit for connecting one of the AC terminals of the armature windings of the polyphase dynamo-electric machine to a cathode potential of the DC power supply, to thereby cause a constant current to flow from the one of the AC terminals of the armature windings of the polyphase dynamo-electric machine to the cathode potential of the DC power supply;
a pull-up resistor for connecting others of the AC terminals of the armature windings of the polyphase dynamo-electric machine, to which the sink type constant current circuit is not connected, to an output terminal of the internal power supply circuit;

backflow prevention diodes connected in series with the pull-up resistor, for preventing a backflow current from the others of the AC terminals of the armature windings of the polyphase dynamo-electric machine to the internal power supply circuit;

a phase voltage detection unit for detecting phase voltages of the armature windings of the polyphase dynamo-electric machine; and processing circuitry configured to determine a power fault, an earth fault, and an open fault of the armature windings of the polyphase dynamo-electric machine based on the phase voltages of respective phases which are detected by the phase voltage detection unit, wherein the processing circuitry determines, in a state in which all the power semiconductor switching elements are in an off state and no induction voltage is generated in the armature windings of the polyphase dynamo-electric machine, the power fault when all the phase voltages are substantially equal to an anode potential of the DC power supply, the earth fault when all the phase voltages are substantially equal to the cathode potential of the DC power supply, and the open fault when all the phase voltages are not substantially the same potential.

2. A power conversion device, in which a plurality of phase bridge circuits each including power semiconductor switching elements, which are connected in series with each other to construct an upper arm and a lower arm, are connected in parallel to one another, both terminals of the plurality of phase bridge circuits are connected to a DC power supply, which is chargeable and dischargeable, and nodes between the power semiconductor switching elements of the upper arm and the lower arm of the plurality of phase bridge circuits are connected to AC terminals of armature windings of a polyphase dynamo-electric machine, for performing AC-DC power conversion or DC-AC power conversion, the power conversion device comprising:

an internal power supply circuit;

a driving circuit for turning on or off the power semiconductor switching elements;

a discharge type constant current circuit for connecting an output terminal of the internal power supply circuit and one of the AC terminals of the armature windings of the polyphase dynamo-electric machine, to thereby cause a constant current to flow from the output terminal of the internal power supply circuit to the one of the AC terminals of the armature windings of the polyphase dynamo-electric machine;

a backflow prevention diode connected in series with the discharge type constant current circuit, for preventing a backflow current from the one of the AC terminals of the armature windings of the polyphase dynamo-electric machine to the internal power supply circuit;

a pull-down resistor for connecting others of the AC terminals of the armature windings of the polyphase dynamo-electric machine, to which the discharge type constant current circuit is not connected, to a cathode potential of the DC power supply;

a sink type constant current circuit connected in series with one of the pull-down resistor, for causing a constant current to flow from an AC terminal of the armature windings of the polyphase dynamo-electric machine to the cathode potential of the DC power supply;

a phase voltage detection unit for detecting phase voltages of the armature windings of the polyphase dynamo-electric machine; and processing circuitry configured to determine a power fault, an earth fault, and an open fault of the armature windings of the polyphase dynamo-electric machine based on the phase voltages of respective phases which are detected by the phase voltage detection unit, wherein the processing circuitry determines, in a state in which all the power semiconductor switching elements are in an off state and no induction voltage is generated in the armature windings of the polyphase dynamo-electric machine, the power fault when all the phase voltages are substantially equal to an anode potential of the DC power supply, the earth fault when all the phase voltages are substantially equal to the cathode potential of the DC power supply, and the open fault when all the phase voltages are not substantially the same potential.

3. The power conversion device according to claim 1, further comprising a second internal power supply circuit for outputting a voltage that is smaller than the output voltage of the internal power supply circuit, wherein the others of the AC terminals of the armature windings of the polyphase dynamo-electric machine, which are connected to the cathode potential of the DC power supply, are connected to an output terminal of the second internal power supply circuit via the sink type constant current circuit, and wherein the processing circuitry determines, in the state in which all the power semiconductor switching elements are in the off state and no induction voltage is generated in the armature windings of the polyphase dynamo-electric machine, a phase to be open-circuited when a phase voltage of the phase is equal to one of the output voltage of the internal power supply circuit and an output voltage of the second internal power supply circuit, the power fault when the phase voltages are substantially equal to the anode potential of the DC power supply, and the earth fault when the phase voltages are substantially equal to the cathode potential of the DC power supply.

* * * * *